US010833775B1

(12) United States Patent
Wang et al.

(10) Patent No.: US 10,833,775 B1
(45) Date of Patent: Nov. 10, 2020

(54) TECHNIQUES FOR MAGNETIC SHIELDING OF AN OPTICAL ISOLATOR TO MAINTAIN NOMINAL MAGNETIC FLUX DENSITY AND A TRANSMITTER OR TRANSCEIVER SYSTEM IMPLEMENTING SAME

(71) Applicant: Applied Optoelectronics, Inc., Sugar Land, TX (US)

(72) Inventors: Chong Wang, Stafford, TX (US); Kai-Sheng Lin, Sugar Land, TX (US); Yongxuan Liang, Stafford, TX (US); I-Lung Ho, Sugar Land, TX (US)

(73) Assignee: Applied Optoelectronics Inc., Sugar Land, TX (US)

( * ) Notice: Subject to any disclaimer, the term of this patent is extended or adjusted under 35 U.S.C. 154(b) by 0 days.

(21) Appl. No.: 16/387,816

(22) Filed: Apr. 18, 2019

(51) Int. Cl.
*H04B 10/00* (2013.01)
*H04B 10/80* (2013.01)
*G02B 6/42* (2006.01)
*H04J 14/02* (2006.01)
*H04B 10/50* (2013.01)
*H05K 9/00* (2006.01)

(52) U.S. Cl.
CPC ......... *H04B 10/802* (2013.01); *G02B 6/4277* (2013.01); *H04B 10/501* (2013.01); *H04J 14/0287* (2013.01); *H05K 9/0058* (2013.01)

(58) Field of Classification Search
CPC ........ H04B 10/40; H04B 10/50; H04B 10/60; H04B 10/803; H04B 10/802; H04B 10/501; G02B 6/4249; G02B 6/4277; H01L 31/167; H04J 14/0287; H05K 9/0058

USPC ......... 398/82, 135, 138, 139, 141, 164, 182, 398/200, 201
See application file for complete search history.

(56) References Cited

U.S. PATENT DOCUMENTS

| | | | | |
|---|---|---|---|---|
| 3,890,582 | A * | 6/1975 | Jeong | H01P 1/383 333/24.2 |
| 4,671,658 | A * | 6/1987 | Shaw | G01C 19/72 356/460 |
| 4,910,727 | A * | 3/1990 | Fussganger | H04B 10/40 398/139 |
| 5,359,689 | A * | 10/1994 | Iwatsuka | G02B 6/4208 385/33 |
| 6,515,789 | B1 * | 2/2003 | Morgan | G02F 1/09 359/280 |
| 8,228,059 | B2 * | 7/2012 | Iwasaki | C23C 14/08 324/244.1 |
| 9,366,735 | B2 * | 6/2016 | Kawabata | G01R 33/26 |
| 9,810,863 | B2 * | 11/2017 | Akashi | G02B 6/2746 |
| 10,014,658 | B1 * | 7/2018 | Norberg | H01S 5/5027 |

(Continued)

*Primary Examiner* — Hibret A Woldekidan
(74) *Attorney, Agent, or Firm* — Grossman Tucker Perreault & Pfleger, PLLC; Norman S. Kinsella

(57) ABSTRACT

In general, the present disclosure is directed to a transmitter optical subassembly (TOSA) module for use in an optical transceiver or transmitter that includes a magnetically-shielded optical isolator to minimize or otherwise reduce magnetization of TOSA components. An embodiment of the present disclosure includes a TOSA housing with magnetic shielding at least partially surrounding an optical isolator, with the magnetic shielding reflecting associated magnetic energy away from components, such as a metal TOSA housing or components disposed therein, that could become magnetized and adversely impact the magnetic flux density of the magnetic field associated with the optical isolator.

16 Claims, 7 Drawing Sheets

(56) References Cited

U.S. PATENT DOCUMENTS

| | | | |
|---|---|---|---|
| 10,113,905 B2* | 10/2018 | Berthoud | G01J 1/0455 |
| 10,142,712 B2* | 11/2018 | Garcia | H04B 10/40 |
| 10,698,168 B1* | 6/2020 | Lin | H01S 5/02288 |
| 2002/0172476 A1* | 11/2002 | Nagase | G02B 6/4204 |
| | | | 385/92 |
| 2015/0245114 A1* | 8/2015 | Ho | H04J 14/0282 |
| | | | 398/34 |
| 2016/0378148 A1* | 12/2016 | Logan | H01R 24/64 |
| | | | 361/679.32 |
| 2017/0075079 A1* | 3/2017 | Lin | G02B 6/4228 |
| 2018/0138131 A1* | 5/2018 | Kawabata | H01F 1/14708 |

\* cited by examiner

TECHNIQUES FOR MAGNETIC SHIELDING OF AN OPTICAL ISOLATOR TO MAINTAIN NOMINAL MAGNETIC FLUX DENSITY AND A TRANSMITTER OR TRANSCEIVER SYSTEM IMPLEMENTING SAME

TECHNICAL FIELD

The present disclosure relates to optical communications and more particularly, to techniques for magnetically shielding an optical isolator to reflect/direct an associated magnetic field of the same away from electrically-sensitive components and/or components prone to magnetization such as a metal housing.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to thermal management, insertion loss, and manufacturing yield.

Optical transceiver modules and transmitter modules include one or more transmitter optical subassemblies (TOSAs) for transmitting optical signals. In general, TOSAs include one or more lasers to emit one or more channel wavelengths, optical components such as optical isolators, and associated circuitry for driving the lasers. Optical isolators can utilize a magnetic field to determine their respective direction of propagation for incident channel wavelengths. However, components of a TOSA such as metal housings can become magnetized when exposed to the magnetic field of the optical isolator, which can adversely impact the magnetic flux density of the magnetic field of the optical isolator. This can result in a substantial drop in output power of the optical isolator. The proximity of the optical isolator, and by extension the associated magnetic field, becomes ever closer to components that could become magnetized as TOSAs scale. Continued development of TOSA modules depends, at least in part, on minimizing or otherwise reducing the potential of such magnetization.

BRIEF DESCRIPTION OF THE DRAWINGS

These and other features and advantages will be better understood by reading the following detailed description, taken together with the drawings wherein.

DETAILED DESCRIPTION

Figure 1A:
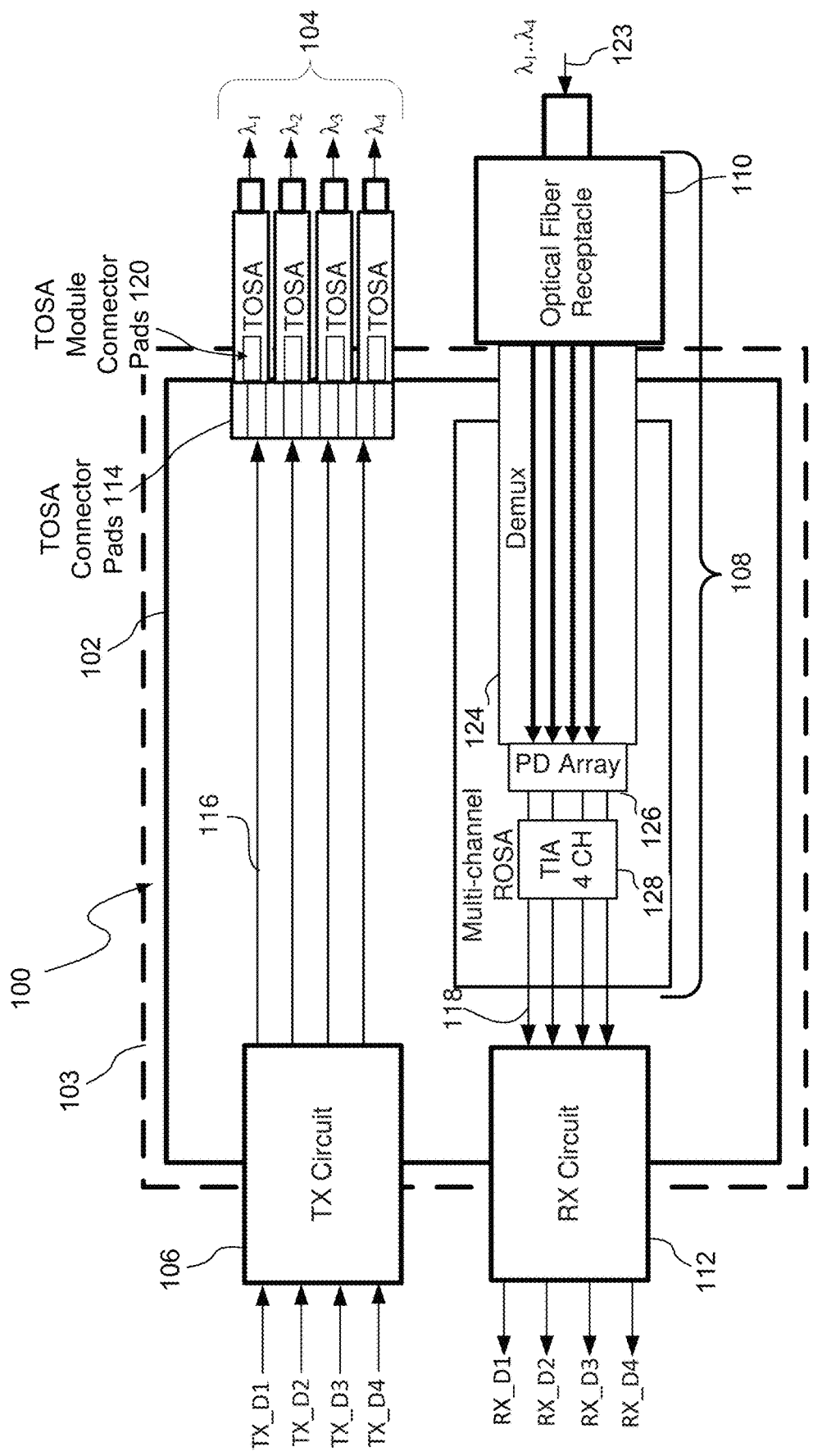
FIG. 1A is a block diagram of a multi-channel optical transceiver, consistent with an embodiment of the present disclosure.

In general, the present disclosure is directed to a transmitter optical subassembly (TOSA) module for use in an optical transceiver or transmitter that includes a magnetically-shielded optical isolator to minimize or otherwise reduce potential magnetization of TOSA components by exposure to the associated magnetic field of the optical isolator. Embodiments of the present disclosure include a TOSA housing with magnetic shielding at least partially surrounding an optical isolator, with the magnetic shielding reflecting/directing associated magnetic energy away from components that could become magnetized.

In an embodiment, the magnetic shielding includes a substantially cylindrical body with a cavity extending therebetween, with the cavity having a shape/profile designed to securely hold both an optical isolator and associated magnet in alignment with an optical path of the TOSA. To this end, the magnetic shielding (with the optical isolator disposed within the cavity of the substantially cylindrical body) can be disposed in, for example, a portion of the TOSA housing that mates the same to an optical coupling receptacle, or any other suitable TOSA location that brings the shielded optical isolator in alignment with the light path of the TOSA housing to receive emitted channel wavelengths. The optical coupling receptacle and/or TOSA housing may be formed from a material that can become magnetized such as iron or iron alloy (e.g., steel), with the magnetic shielding at least substantially preventing magnetization of the same in addition to other TOSA components within proximity of the optical isolator.

Alternatively, or in addition to the magnetic shielding described above, magnetic shielding for an optical isolator can be provided by the materials forming an optical coupling receptacle and/or at least a portion of the TOSA housing itself. For instance, an embodiment of the present disclosure includes a TOSA housing having a coupling portion (or housing portion) for optically coupling a laser diode arrangement disposed within the TOSA housing with an external transmit fiber. In this embodiment, the TOSA housing can include a hermetically-sealed cavity for ensuring nominal signal integrity over transmission distances of, for instance, up to 10 km and beyond. Note, this disclosure is equally applicable to TOSA housing without a hermetically-sealed cavity. The coupling portion of the housing can include a first end that at least partially extends within the TOSA housing and a second end to mate with a ferrule receptacle. A cavity may therefore extend from an aperture of the TOSA housing through the coupling portion and fiber ferrule to provide a light path to launch wavelengths from the laser arrangement within the hermetically-sealed cavity on to a transmit optical fiber. However, in this embodiment at least the coupling portion of the TOSA housing is formed from a non-magnetic or paramagnetic material, such as aluminum or other suitable metal or metal alloy. To this end, the coupling portion of the TOSA housing may also be referred to herein as a magnetically-shielded coupling portion. The magnetically-shielded coupling portion of the TOSA housing includes a cavity with an inner diameter and shape/profile that corresponds with an optical isolator and associated magnet. Thus, the optical isolator and associated magnet get disposed within the cavity and magnetic energy of the same gets reflected away from the TOSA housing, and in particular a portion of the TOSA housing that could become magnetized.

In one specific example embodiment, a TOSA module includes a housing with a hermetically-sealed cavity having a laser arrangement for emitting an associated channel wavelength. A coupling portion of the TOSA housing extends at least partially into the hermetically-sealed cavity of the housing and is formed of a non-magnet or paramagnetic material. The coupling portion of the TOSA housing defines a cavity for receiving an optical isolator and associated magnet, and optically aligns the same with the laser arrangement within the hermetically-sealed cavity. To this end, the coupling portion of the TOSA housing may also be referred to herein as an optical isolator mount or receptacle.

Materials chosen to provide magnetic shielding as discussed above can include, for example, a non-magnetic or paramagnetic material such as, for example, aluminum or aluminum alloy. Examples and scenarios disclosed herein specifically refer to aluminum or an aluminum alloy for magnetic shielding, although other metals, metal alloys, and non-metal materials may also be utilized to magnetically shield an optical isolator and are also within the scope of this disclosure. In addition, materials chosen to provide magnetic shielding can include materials having a thermal expansion coefficient of less than 11 to ensure that expansion/contraction of the magnetic shield remains within a predefined tolerance.

Accordingly, a TOSA module consistent with the present disclosure can provide a magnetically-shielded optical isolator that minimizes or otherwise reduces the potential for magnetization of components that could negatively impact isolator performance. Optical components may therefore be disposed proximate the optical isolator, which by extension allows for TOSA housings consistent with the present disclosure to have a smaller overall footprint/profile relative to other TOSA approaches that do not include a magnetically-shielded optical isolator, e.g., such as approaches that utilize an elongated housing to keep the magnetic field of the optical isolator at a suitable distance from other TOSA components. Accordingly, aspects of the present disclosure significantly reduce challenges related to scaling of TOSA housing to achieve ever-greater channel density of optical transceiver and transmitter systems.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to other wavelength standards such as, for example, coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

As used herein, the terms hermetic-sealed and hermetically-sealed may be used interchangeably and refer to a housing that releases a maximum of about $5*10^{-8}$ cc/sec of filler gas. The filler gas may comprise an inert gas such as nitrogen, helium, argon, krypton, xenon, or various mixtures thereof, including a nitrogen-helium mix, a neon-helium mix, a krypton-helium mix, or a xenon-helium mix.

Referring to the Figures, FIG. 1A illustrates an optical transceiver module 100, consistent with embodiments of the present disclosure. The optical transceiver module 100 is shown in a highly simplified form for clarity and ease of explanation and not for purposes of limitation. In this embodiment, the optical transceiver module 100 transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be 1270 nm, 1290 nm, 1310 nm, and 1330 nm, respectively. Other channel wavelengths are within the scope of this disclosure including those associated with local area network (LAN) wavelength division multiplexing (WDM). The optical transceiver 100 may also be capable of transmission distances of 2 km to at least about 10 km. The optical transceiver 100 may be used, for example, in internet data center applications or fiber to the home (FTTH) applications.

In an embodiment, the optical transceiver module 100 is disposed in a transceiver housing 103 or cage. The transceiver housing 103 can be configured with one or more cavities to receive and removably couple to one or more optical transceiver modules, such as N number of pluggable small form-factor (SFF) modules, depending on a desired configuration.

The optical transceiver module 100 may include a number of components to support transceiver operations. The optical transceiver module 100 may include an optical transceiver substrate 102, a plurality of transmitter optical subassemblies (TOSA) modules 104 for transmitting optical signals on different channel wavelengths, transmit connecting circuit 106, a multi-channel receiver optical subassembly (ROSA) arrangement 108 for receiving optical signals on different channel wavelengths, an optical fiber receptacle 110 to receive and align a fiber connector (e.g., a ferrule) with the ROSA, and a receiver connecting circuit 112.

The optical transceiver substrate 102 includes traces, connector pads, and other circuitry to support transceiver operations. The optical transceiver substrate 102 may include TOSA connector pads 114 (or terminals 114) that enable each of the TOSA modules 104 to mount and electrically couple to the optical transceiver substrate 102. The optical transceiver substrate 102 may include traces 116 that couple the TOSA connector pads 114 to the transmit connecting circuit 106. The optical transceiver substrate 102 may include traces 118 that electrically couple the ROSA arrangement 108 to the receiver connecting circuit 112. The optical transceiver substrate 102 may be manufactured from a multi-layer printed circuitry board (PCB), although other types of substrates may be utilized and are within the scope of this disclosure.

Each of the TOSA modules 104 may be configured to receive driving electrical signals (TX_D1 to TX_D4), convert the electrical signals to a multiplexed optical signal (e.g., a signal with channel wavelengths λ1 . . . λn) and output the same to a multiplexer (not shown). Each of the TOSA modules 104 may be electrically coupled to the TOSA connector pads 114 and to the traces 116 through TOSA module connector pads 120. Each of the TOSA modules 104 may include a laser diode device and supporting components and circuitry such as focus lens, optical isolator and thermoelectric cooler (TEC). As discussed in greater detail below with reference to FIGS. 2-6, each of the TOSA modules 104 can include a magnetically-shielded optical isolator. The laser diode devices of the TOSA modules 104 may include distributed feedback lasers (DFBs), electro-absorption modulated lasers (EMLs), vertical external-cavity surface-emitting lasers (VECSEL) or other suitable laser devices.

As further in shown FIG. 1A, the multi-channel ROSA arrangement 108 includes an optical demultiplexer 124, a photodetector array 126 (e.g., photodiodes), and a transimpedance amplifier (TIA) 128 or amplification circuit 128 for amplifying and converting optical signals into electrical signals.

In operation, the optical demultiplexer 124 receives the optical signal from the receive optical fiber 123 and then provides separated channel wavelengths from the same to the array of photodiodes 126. In turn, the array of photodiodes 126 converts the received channel wavelengths into an electrical signal and provides the same to the TIA 128. The TIA then amplifies and provides the receiver connecting circuit 112 with electrical signals (RX_D1 to RX_D4) corresponding to the received channel wavelengths. The receiver connecting circuit 112 is electrically connected to the electronic components (e.g., the laser, monitor photodiode, etc.) in the ROSA 108. The receiver connecting circuit 112 can include conductive paths to provide electrical connections and may also include additional circuitry.

Figure 1B:
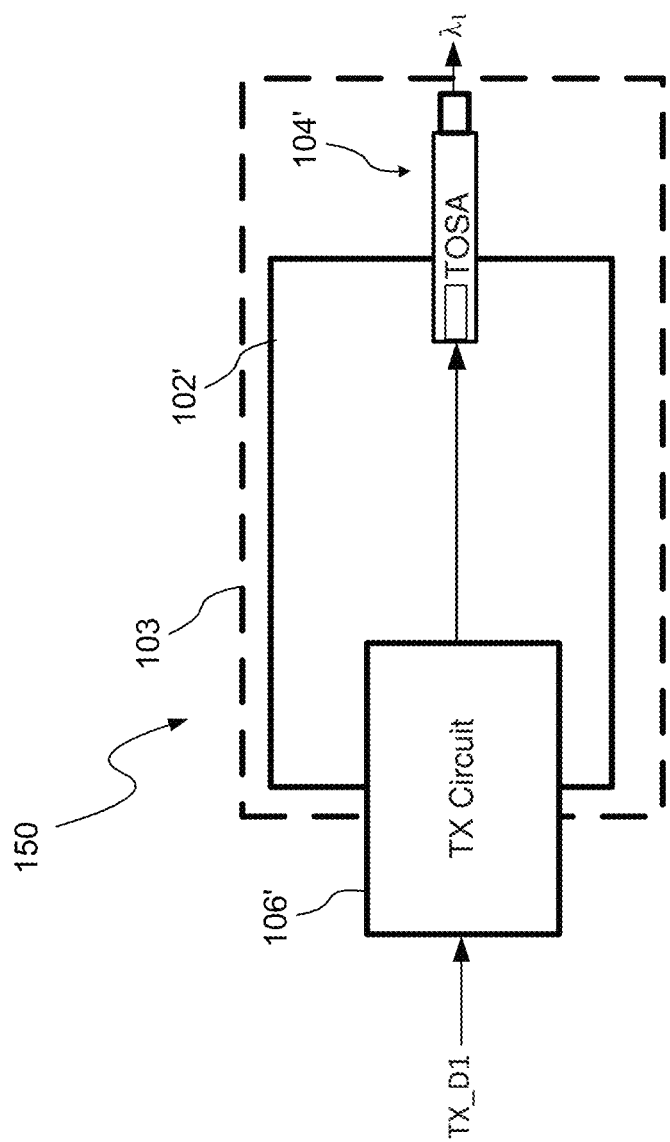
FIG. 1B is a block diagram of a transmitter subassembly consistent with an embodiment of the present disclosure.
Figure 2:
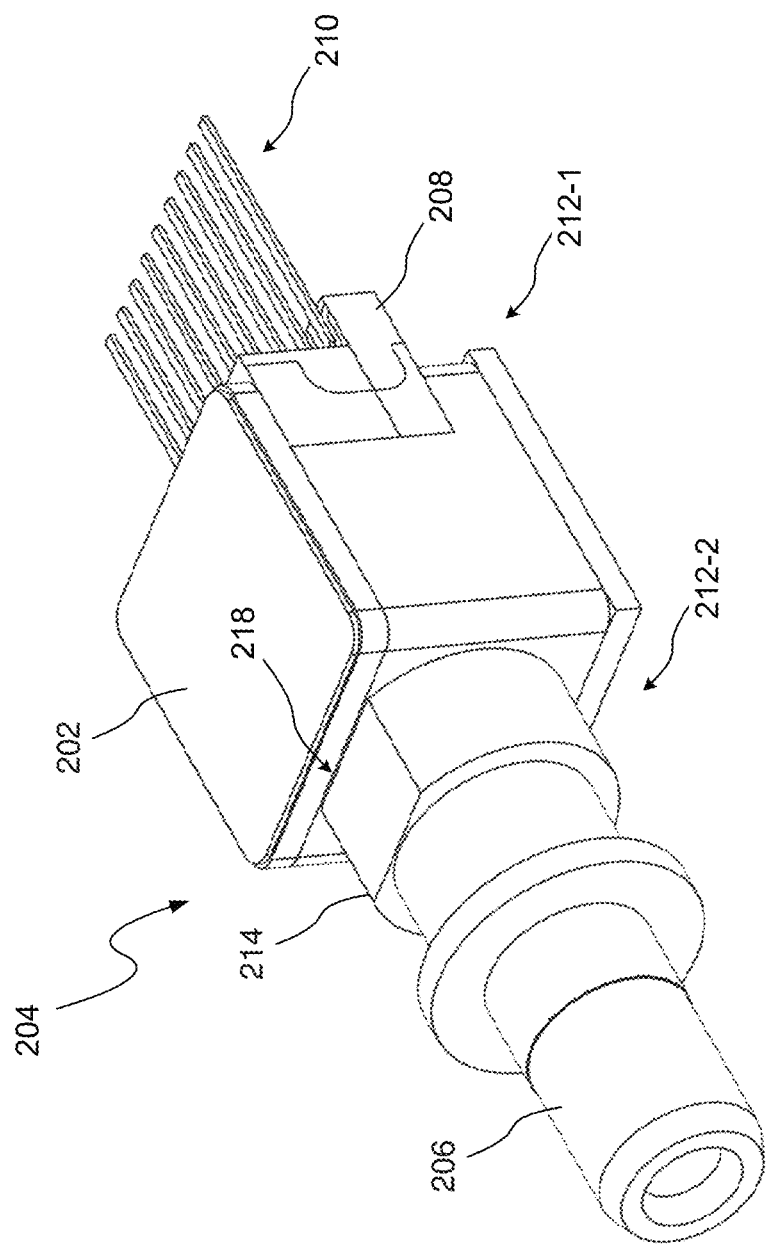
FIG. 2 is a perspective view of transmitter optical subassembly (TOSA) module consistent with embodiments of the present disclosure.
Figure 3:
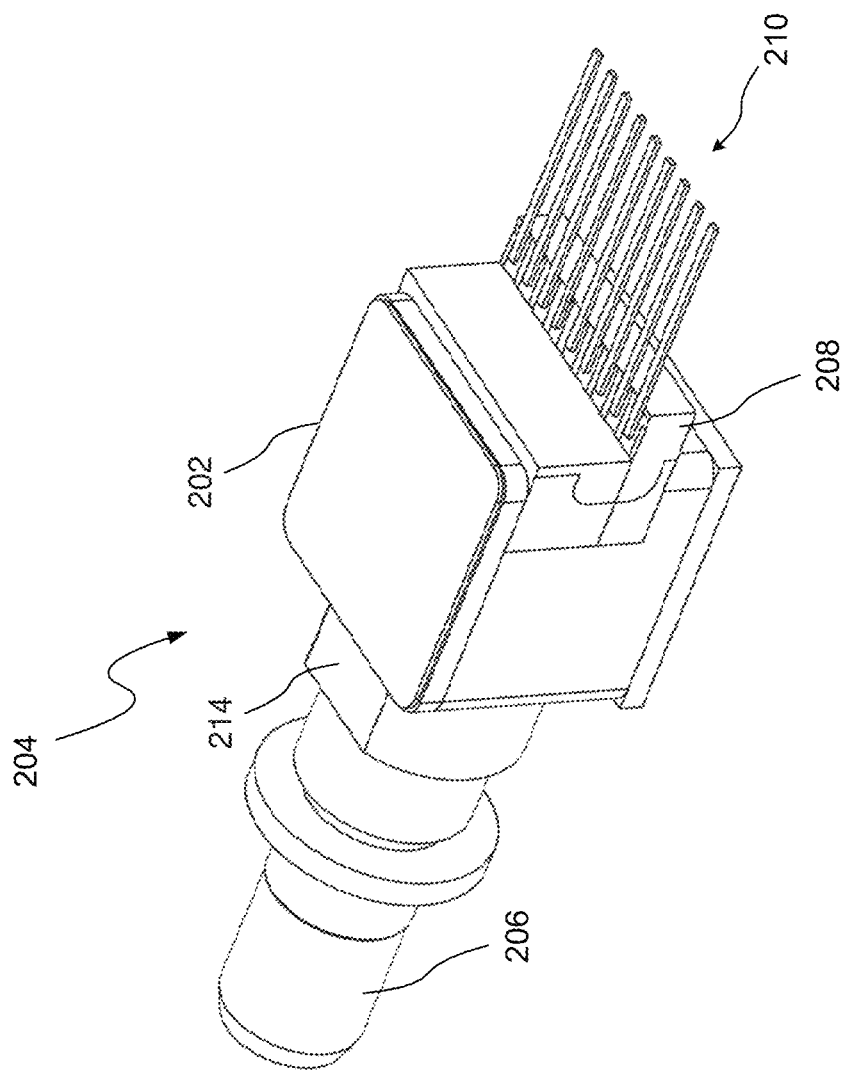
FIG. 3 is another perspective view of the TOSA module of FIG. 2, consistent with embodiments of the present disclosure.

FIG. 1B shows an example transceiver subassembly 150 consistent with an embodiment of the present disclosure. As shown the transceiver subassembly 150 is highly simplified and does not illustrate receiver components for purposes of clarity. As shown, the transceiver subassembly 150 includes a transmit connecting circuit 106' and TOSA 104' coupled to a substrate 102'. The transceiver subassembly 150 may be removably coupled into, for instance, a cage 103. The transmit connecting circuit 106' can provide an electrical signal (TX_D1) to modulate the TOSA 104' and cause the same to emit an associated channel wavelength ($\lambda_1$). The TOSA 104' can include a magnetically-shielded optical isolator as discussed in greater detail below.

Referring to FIGS. 2-6, an example transmitter optical subassembly module (TOSA) 204 is shown consistent with embodiments of the present disclosure. The TOSA module 204 is suitable for use in an optical transceiver system of FIG. 1A or optical transmitter such as the transmitter subassembly of FIG. 1B. The TOSA module 204 includes a housing 202 and an optical coupling receptacle 206.

Figure 5:
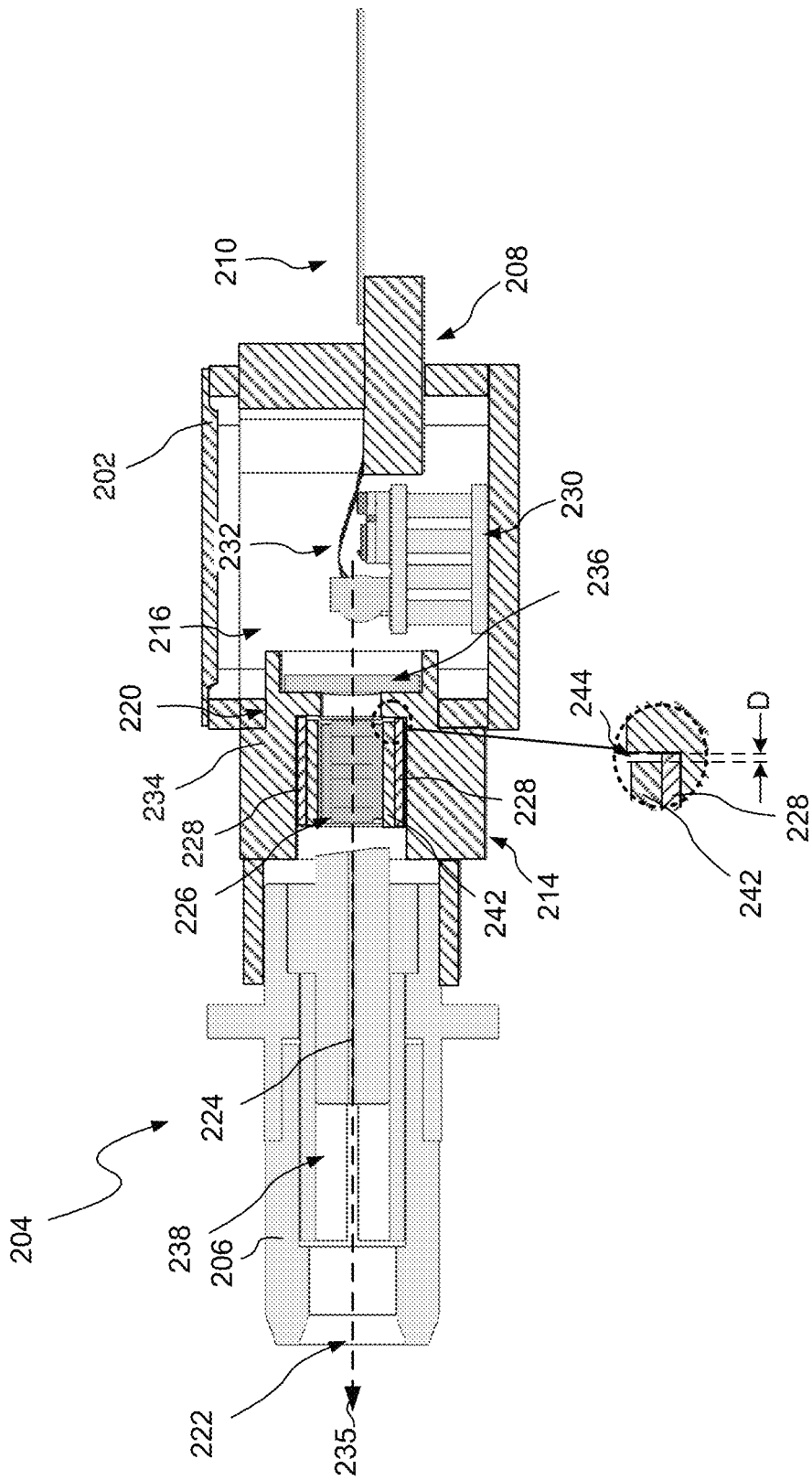
FIG. 5 is a cross-sectional view of the TOSA module of FIG. 4 taken along line 5-5, in accordance with an embodiment of the present disclosure.

In particular, the housing 202 includes a plurality of sidewalls that define a cavity 216 (See FIG. 5). The cavity may be hermetically-sealed, and thus, the example TOSA module 204 may also be referred to as a hermetically-sealed TOSA module or a hermetically-sealed light engine. However, other embodiments are within the scope of this disclosure and the cavity 216 may not necessarily be hermetically-sealed.

A first end 212-1 of the housing includes a feedthrough device 208 and a plurality of electrical leads/pins 210. The electrical leads/pins 210 can electrically couple to, for instance, the TOSA connecting pads 114 of the optical transceiver shown in FIG. 1A. The feedthrough device 208 thus provides electrical connectivity to provide power and radio frequency (RF) driving signals, e.g., from the transmit connecting circuit 106, to the optical components within the cavity 216 of the housing 202. A second end 212-2 of the housing 202, opposite the first end 212-1, includes a mounting region/receptacle for coupling to and securely holding the optical coupling receptacle 206 a predetermined position. The second end 212-2 includes an aperture 220 (see FIG. 5) to allow for optical components of the TOSA module 204 to optically couple to the optical coupling receptacle to launch channel wavelengths onto an external transmit fiber, for example. Accordingly, the first end 212-1 may therefore be referred to as an electrical coupling end and the second end 212-2 may be referred to as an optical coupling end.

The housing 202 may comprise, for example, a metal or metal alloy. In some cases, the housing 202 comprises a metal alloy comprising nickel, cobalt and iron commonly referred to as Kovar (e.g., ASTM F-15 alloy). Other metal and metal alloys are within the scope of this disclosure including non-metal materials that are suitably rigid.

Figure 4:
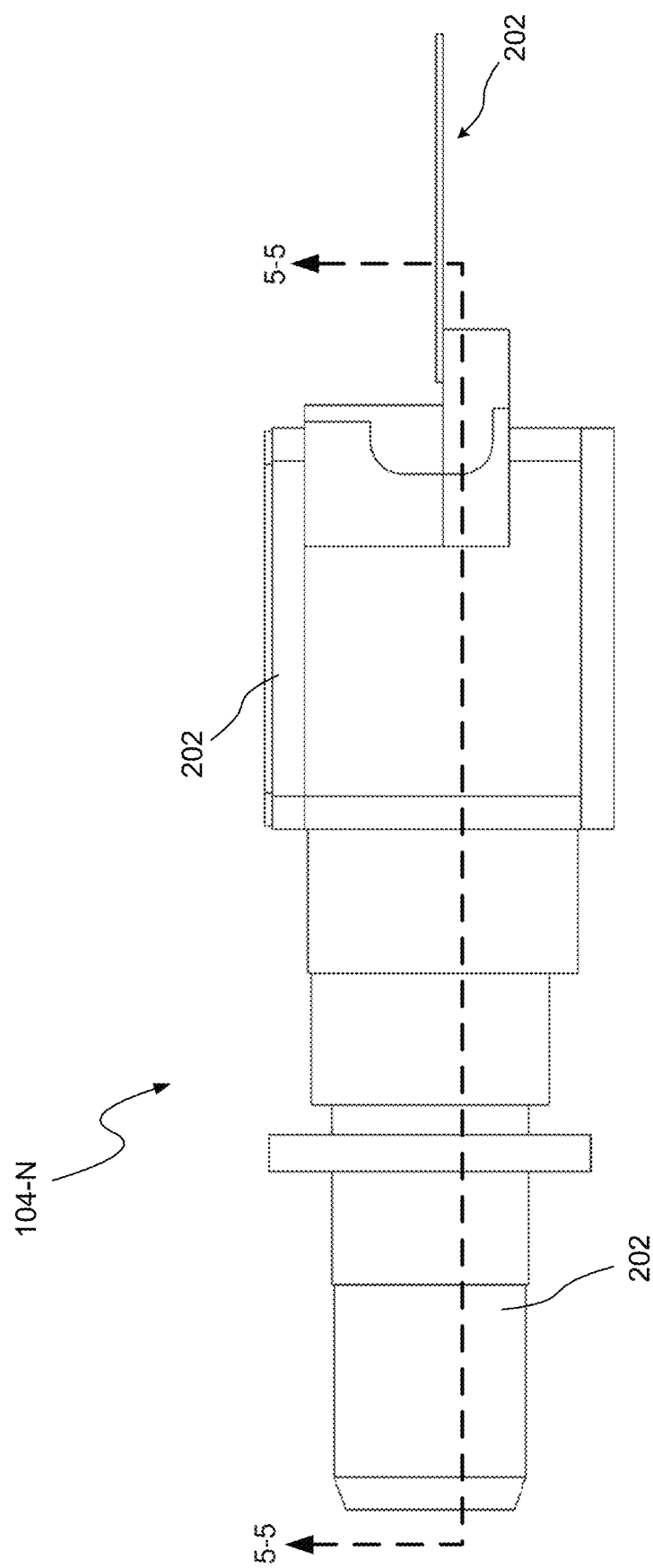
FIG. 4 is a side view of the TOSA module of FIG. 2, consistent with embodiments of the present disclosure.

With specific reference to FIG. 5, a cross-sectional view of the example TOSA module 204 taken along line 5-5 of FIG. 4 is shown consistent with an embodiment of the present disclosure. As shown, the optical coupling receptacle 206 includes a first end with an opening/receptacle 222 to couple to, for example, a ferrule. The opening 222 then transitions to a cavity 238 that extends along the longitudinal length of the optical coupling receptacle 206 to provide a light path 235 therethrough. The optical coupling receptacle 206 further includes a fiber stub 224 within the cavity 238 following the opening 222. The TOSA housing 202 includes a TEC 230 and a laser arrangement 232 supported by the same. The laser arrangement 232 is configured to emit associated channel wavelengths along light path 235.

As further shown, the optical coupling receptacle 206 mechanically couples to the housing 202 via a coupler 214 (or coupler portion) of the housing 202. Note, the coupler 214 may be accurately considered as forming a portion of the housing 202. However, in other embodiments the coupler 214 may be a component of the optical coupling receptacle 206 itself. The coupler 214 of the housing 202 includes a body 214 with a first end for coupling/mating with the receptacle 222 and a second end for coupling/mating to the housing 202. At least a portion of the coupler 214 extends into the cavity 216 of the housing 202 and securely hold a window lens 236 in optical alignment with other optical components within the cavity 216 of the housing 202.

In the embodiment of FIG. 5, the coupler 214 of the housing 202 further includes a substantially cylindrical magnet 242 that at least partially surrounds the optical isolator 226 within the cavity 216. The associated magnetic field introduced by the cylindrical magnet 242 determines a direction of propagation for the channel wavelengths received via the aperture 220 along the light path 235. In this embodiment, the coupler 214 further includes a magnetic shield 228 that at least partially surrounds both the optical isolator, and more importantly, the cylindrical magnet 242. The shape of the magnetic shield 228 may be substantially cylindrical, as shown, to generally correspond with the cylindrical shape of the magnet 242 and/or optical isolator 226. To this end, the magnetic shield 228 may also be described as a magnetic shielding pipe or simply a pipe. However, other profiles/shapes for the magnetic shield 228 are within the scope of this disclosure.

As shown in FIG. 5, the magnet 242 is displaced from the adjacent sidewall of the coupler 214 to provide a gap 244. The gap 244 measures a distance of D, with D being at least 10 microns.

Continuing on, the magnetic shield 228 includes a curved sidewall that at least partially surrounds the optical isolator 226, and preferably, fully-surrounds the optical isolator 226 along its entire length, such as shown. The magnetic shield 228 may comprise any paramagnetic or non-magnetic material. For example, the magnetic shield 228 may comprise any metal or metal alloy that weakly attracts proximate magnetic fields but is resistant to magnetization. The magnetic shield 228 reflects/directs magnetic energy of the associated magnetic field of the optical isolator 226 away from components that could become magnetized in response to the magnetic field introduced by the magnet 242. The magnetic field of the optical isolator 226 is more clearly illustrated in the embodiment of FIG. 6. Without magnetic shielding, the housing 202 and can become magnetized after exposure to the associated magnetic field of the magnet 242 in scenarios where the housing 202 comprises a ferromagnetic metal, for instance. The magnetization of the housing 202 may then adversely impact the magnetic flux density of the associated magnetic field, which can ultimately reduce output power of the TOSA module 204. The material of the magnetic shield 228 can be different from that of the material forming the coupler 214 in the embodiment of FIG. 2. For instance, the magnetic shield 228 can be formed of a first material comprising aluminum, or an aluminum alloy, and the coupler 214 can be formed from a second material different from the first material, the second material being prone to magnetization such as iron, or an alloy thereof.

Figure 6:
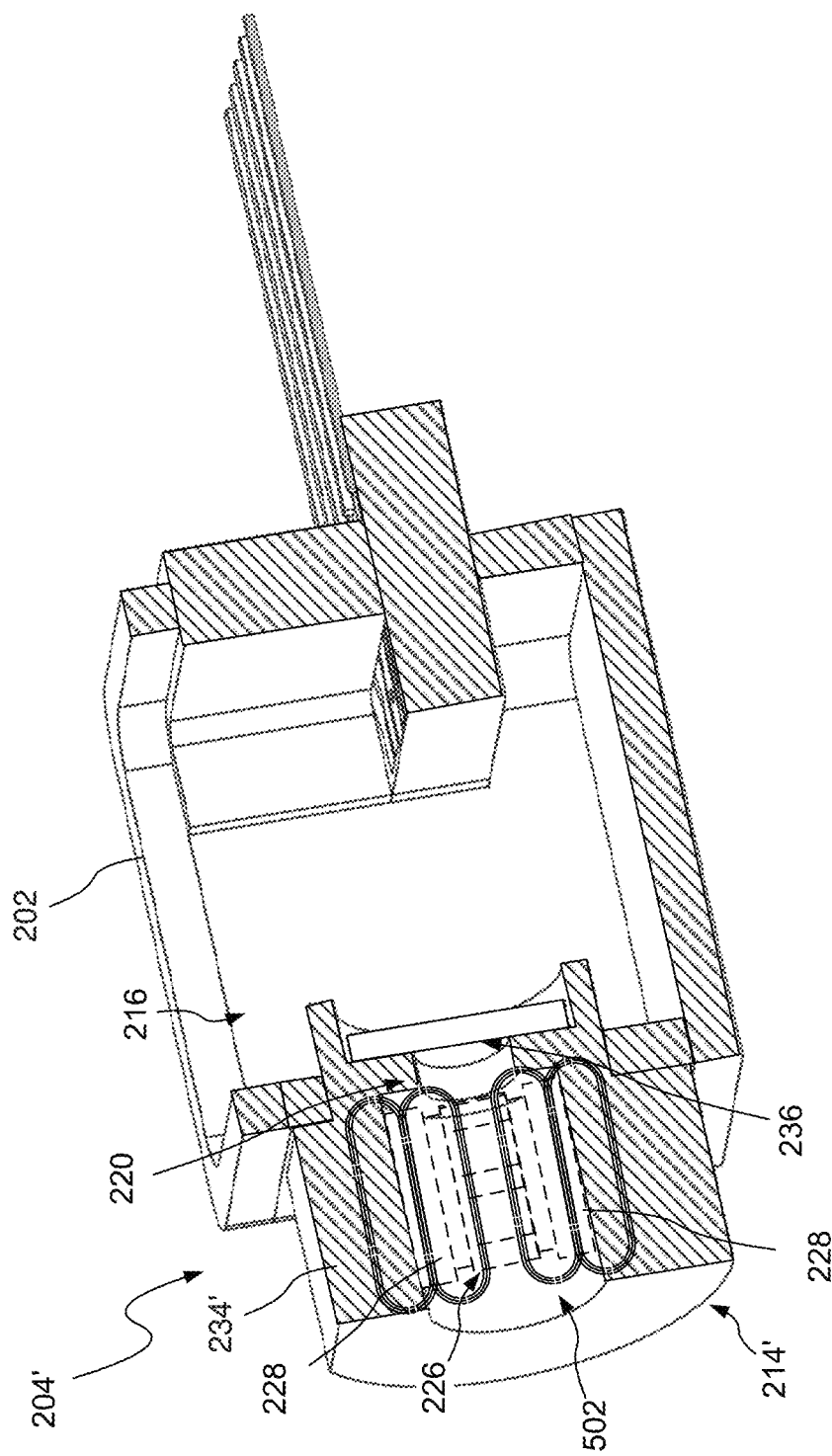
FIG. 6 is another cross-sectional view of the TOSA module of FIG. 4 taken along line 5-5, in accordance with an embodiment of the present disclosure.

FIG. 6 shows a cross-sectional view of an embodiment of a TOSA module 204' partially-exploded. The housing 202 is shown in isolation and without a laser arrangement and ferrule receptacle for purposes of clarity and not limitation. The housing 202 may be configured substantially similar to the embodiment shown in FIG. 4, for example, and the teachings of which are equally applicable but will not be repeated for brevity.

In more detail, the coupler 214' of the housing 202 can comprise a single piece of paramagnetic or non-magnetic material, or multiple pieces. The coupler 214' includes a body 234' that has a substantially cylindrical profile, although other embodiments are within the scope of this disclosure. At least a first portion of the body 234' proximate the optical isolator 226 surrounds the optical isolator 226 along the entire length of the same. In this embodiment, the optical isolator 226 includes magnet 242, but does not necessarily include the associated magnetic shielding 228 as discussed above with regard to FIG. 5. The first portion of the body 234' transitions to a second portion that extends at least partially into the cavity 216. The outer diameter of the second portion of the body 234' is less than the outer diameter of the first portion of the body 234'. However, the inner diameter of the first and second portions of the body 234' may be substantially equal, such as shown. The second portion can provide a lens holder/mount portion for securely holding the window lens 236 in place.

As shown, the body 234' of the coupler 214' comprises a paramagnetic or non-magnetic material. Therefore, the body 234' of the coupler may be accurately referred to as a magnetically-shielded optical isolator mount or simply as a magnetic shield. In this embodiment, the coupler 214' may comprise any metal, or metal alloy, that weakly attracts proximate magnetic fields but is resistant to magnetization.

The particular material for the coupler 214' and/or magnetic shield 228 may be selected, at least in part, based on a desired thermal expansion coefficient. For example, the thermal expansion coefficient for the material of the coupler 214' can be substantially equal to that of the material forming to the housing 202 to ensure structural integrity. In an embodiment, the material forming the coupler 214 and/or magnetic shield 228 has a thermal expansion coefficient of less than 11.

In operation, the magnet 242 introduces a magnetic field 502 to define a direction of propagation for channel wavelengths emitted through the optical isolator 226. The body 234' reflects energy of the magnetic field 502 away from the housing 202, and importantly, away from components that could be magnetized such as components disposed within the cavity 216 and/or the housing 202 itself.

In accordance with an aspect of the present disclosure a transmitter optical subassembly (TOSA) module for use in an optical transmitter or optical transceiver is disclosed. The TOSA comprising a housing defining a cavity, a laser diode disposed in the cavity to emit an associated channel wavelength, an optical isolator, the optical isolator optically coupled to the laser diode and having an associated magnetic field to determine a direction of propagation for the associated channel wavelengths, and a magnetic shield at least partially surrounding the optical isolator, the magnetic shield to reflect the associated magnetic field away from the housing of the TOSA to maintain a magnetic flux density of the associated magnetic field.

In accordance with another aspect of the present disclosure a multi-channel optical transceiver is disclosed. The multi-channel optical transceiver comprising a substrate, and a transmitter optical subassembly (TOSA) module coupled to the substrate, the TOSA module comprising a TOSA housing defining a cavity, a laser diode disposed in the cavity to emit an associated channel wavelength, an optical isolator, the optical isolator optically coupled to the laser diode and having an associated magnetic field to determine a direction of propagation for the associated channel wavelengths, and a magnetic shield at least partially surrounding the optical isolator, the magnetic shield to reflect the associated magnetic field away from components of the TOSA module to maintain a magnetic flux density of the associated magnetic field, a receiver optical subassembly (ROSA) coupled to the substrate.

While the principles of the disclosure have been described herein, it is to be understood by those skilled in the art that this description is made only by way of example and not as a limitation as to the scope of the invention. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A transmitter optical subassembly (TOSA) module for use in an optical transmitter or optical transceiver, the TOSA comprising:
   a housing defining a cavity;
   a laser diode disposed in the cavity to emit an associated channel wavelength;

an optical isolator, the optical isolator optically coupled to the laser diode and having an associated magnetic field to determine a direction of propagation for the associated channel wavelengths; and a magnetic shield comprising a paramagnetic or non-magnetic material, the magnetic shield at least partially surrounding the optical isolator, the magnetic shield to reflect the associated magnetic field away from the housing of the TOSA module to maintain a magnetic flux density of the associated magnetic field.

2. The TOSA module of claim 1, further comprising:

an optical coupling receptacle with a first end to couple to a ferrule and a second end to mate to the housing of the TOSA module; and a coupler section with a first end to couple to the optical coupling receptacle and a second end to couple to the housing, the coupler section at least partially extending into the cavity of the housing.

3. The TOSA module of claim 2, wherein the magnetic shield comprises a substantially cylindrical body, the substantially cylindrical body disposed in a cavity defined by the coupler section.

4. The TOSA module of claim 1, wherein the magnetic shield is provided at least in part by the coupler section being formed from a paramagnetic material.

5. The TOSA module of claim 1, wherein the cavity of the housing is hermetically-sealed, and wherein at least a portion of the magnetic shield extends into the hermetically-sealed cavity.

6. The TOSA module of claim 1, wherein the housing is formed of a material prone to magnetization.

7. The TOSA module of claim 1, wherein the magnetic shield comprises aluminum or an alloy thereof.

8. The TOSA module of claim 1, wherein the housing comprises kovar.

9. The TOSA module of claim 1, wherein the magnetic shield comprises a paramagnetic metal.

10. The TOSA module of claim 9, wherein the paramagnetic metal of the magnetic shield at least partially surrounds the optical isolator to maintain the magnetic flux density of the associated magnetic field of the optical isolator.

11. A multi-channel optical transceiver comprising:

a substrate;

a transmitter optical subassembly (TOSA) module coupled to the substrate, the TOSA module comprising:
　a TOSA housing defining a cavity;
　an optical coupling receptacle and a coupler section to couple the optical coupling receptacle to the TOSA housing;
　a laser diode disposed in the cavity to emit an associated channel wavelength;
　an optical isolator, the optical isolator optically coupled to the laser diode and having an associated magnetic field to determine a direction of propagation for the associated channel wavelengths; and
　a magnetic shield at least partially surrounding the optical isolator, the magnetic shield to reflect the associated magnetic field away from components of the TOSA module to maintain a magnetic flux density of the associated magnetic field, wherein the magnetic shield comprises a cylindrical body disposed in a cavity defined by the coupler section;

a receiver optical subassembly (ROSA) coupled to the substrate.

12. The multi-channel optical transceiver of claim 11, wherein the magnetic shielding comprises a paramagnetic or non-magnetic metal.

13. The multi-channel optical transceiver of claim 11, wherein the coupler section at least partially extends into the cavity of the housing when coupled thereto.

14. The multi-channel optical transceiver of claim 11, wherein the coupler forms at least a portion of the magnetic shield.

15. The multi-channel optical transceiver of claim 11, wherein the cavity of the housing is hermetically-sealed, and wherein at least a portion of the magnetic shield extends into the hermetically-sealed cavity.

16. The multi-channel optical transceiver of claim 11, wherein the magnetic shield comprises aluminum or an alloy thereof.

* * * * *